United States Patent
Pandev et al.

(10) Patent No.: US 11,520,321 B2
(45) Date of Patent: Dec. 6, 2022

(54) MEASUREMENT RECIPE OPTIMIZATION BASED ON PROBABILISTIC DOMAIN KNOWLEDGE AND PHYSICAL REALIZATION

(71) Applicant: KLA Corporation, Milpitas, CA (US)

(72) Inventors: Stilian Ivanov Pandev, Santa Clara, CA (US); Wei Lu, Fremont, CA (US); Dzmitry Sanko, Vallejo, CA (US)

(73) Assignee: KLA Corporation, Milpitas, CA (US)

( * ) Notice: Subject to any disclaimer, the term of this patent is extended or adjusted under 35 U.S.C. 154(b) by 246 days.

(21) Appl. No.: 17/065,021

(22) Filed: Oct. 7, 2020

(65) Prior Publication Data

US 2021/0165398 A1 Jun. 3, 2021

Related U.S. Application Data

(60) Provisional application No. 62/942,730, filed on Dec. 2, 2019.

(51) Int. Cl.
| | |
|---|---|
| *G05B 19/418* | (2006.01) |
| *G06T 7/00* | (2017.01) |
| *G06F 30/367* | (2020.01) |

(52) U.S. Cl.
CPC . *G05B 19/41875* (2013.01); *G05B 19/41885* (2013.01); *G06F 30/367* (2020.01); *G06T 7/0004* (2013.01)

(58) Field of Classification Search
None
See application file for complete search history.

(56) References Cited

U.S. PATENT DOCUMENTS

| | | |
|---|---|---|
| 5,608,526 A | 3/1997 | Piwonka-Corle et al. |
| 5,859,424 A | 1/1999 | Norton et al. |

(Continued)

FOREIGN PATENT DOCUMENTS

| | | |
|---|---|---|
| WO | 2017100424 A1 | 6/2017 |
| WO | 2017176637 A1 | 10/2017 |

OTHER PUBLICATIONS

International Search Report dated Mar. 5, 2021, for PCT Application No. PCT/US2020/060642 filed on Nov. 16, 2020 by KLA Corporation, 4 pages.

*Primary Examiner* — Carlos R Ortiz Rodriguez
(74) *Attorney, Agent, or Firm* — Spano Law Group; Joseph S. Spano

(57) ABSTRACT

Methods and systems for training and implementing metrology recipes based on performance metrics employed to quantitatively characterize the measurement performance of a metrology system in a particular measurement application. Performance metrics are employed to regularize the optimization process employed during measurement model training, model-based regression, or both. For example, the known distributions associated with important measurement performance metrics such as measurement precision, wafer mean, etc., are specifically employed to regularize the optimization that drives measurement model training. In a further aspect, a trained measurement model is employed to estimate values of parameters of interest based on measurements of structures having unknown values of one or more parameters of interest. In a further aspect, trained measurement model performance is validated with test data using error budget analysis. In another aspect, a model-based regression on a measurement model is physically regularized by on one or more measurement performance metrics.

20 Claims, 7 Drawing Sheets

(56) References Cited

U.S. PATENT DOCUMENTS

| | | |
|---|---|---|
| 6,023,338 A | 2/2000 | Bareket |
| 6,429,943 B1 | 8/2002 | Opsal et al. |
| 6,716,646 B1 | 4/2004 | Wright et al. |
| 6,778,275 B2 | 8/2004 | Bowes |
| 6,787,773 B1 | 9/2004 | Lee |
| 6,992,764 B1 | 1/2006 | Yang et al. |
| 7,242,477 B2 | 7/2007 | Mieher et al. |
| 7,321,426 B1 | 1/2008 | Poslavsky et al. |
| 7,406,153 B2 | 7/2008 | Berman |
| 7,478,019 B2 | 1/2009 | Zangooie et al. |
| 7,626,702 B2 | 12/2009 | Ausschnitt et al. |
| 7,656,528 B2 | 2/2010 | Abdulhalim et al. |
| 7,826,071 B2 | 11/2010 | Shchegrov et al. |
| 7,842,933 B2 | 11/2010 | Shur et al. |
| 7,873,585 B2 | 1/2011 | Izikson |
| 7,929,667 B1 | 4/2011 | Zhuang et al. |
| 7,933,026 B2 | 4/2011 | Opsal et al. |
| 8,068,662 B2 | 11/2011 | Zhang et al. |
| 8,138,498 B2 | 3/2012 | Ghinovker |
| 9,291,554 B2 | 3/2016 | Kuznetsov et al. |
| 9,826,614 B1 | 11/2017 | Bakeman et al. |
| 9,885,962 B2 | 2/2018 | Veldman et al. |
| 9,915,522 B1 | 3/2018 | Jiang et al. |
| 10,013,518 B2 | 7/2018 | Bakeman et al. |
| 10,101,670 B2 | 10/2018 | Pandev et al. |
| 10,152,678 B2 | 12/2018 | Pandev et al. |
| 10,324,050 B2 | 6/2019 | Hench et al. |
| 10,352,695 B2 | 7/2019 | Dziura et al. |
| 2003/0021465 A1 | 1/2003 | Adel et al. |
| 2007/0176128 A1 | 8/2007 | Van Bilsen et al. |
| 2007/0221842 A1 | 9/2007 | Morokuma et al. |
| 2009/0152463 A1 | 6/2009 | Toyoda et al. |
| 2011/0266440 A1 | 11/2011 | Boughorbel et al. |
| 2012/0292502 A1 | 11/2012 | Langer et al. |
| 2013/0208279 A1 | 8/2013 | Smith |
| 2013/0245985 A1 | 9/2013 | Flock et al. |
| 2013/0304424 A1 | 11/2013 | Bakeman et al. |
| 2014/0019097 A1 | 1/2014 | Bakeman et al. |
| 2014/0064445 A1 | 3/2014 | Adler |
| 2014/0111791 A1 | 4/2014 | Manassen et al. |
| 2014/0172394 A1 | 6/2014 | Kuznetsov et al. |
| 2014/0222380 A1 | 8/2014 | Kuznetsov et al. |
| 2014/0297211 A1 | 10/2014 | Pandev et al. |
| 2015/0046121 A1 | 2/2015 | Dziura et al. |
| 2015/0110249 A1 | 4/2015 | Bakeman et al. |
| 2015/0117610 A1 | 4/2015 | Veldman et al. |
| 2015/0204664 A1 | 7/2015 | Bringoltz et al. |
| 2015/0285749 A1 | 10/2015 | Moncton et al. |
| 2015/0300965 A1 | 10/2015 | Sezginer et al. |
| 2016/0202193 A1 | 7/2016 | Hench et al. |
| 2016/0320319 A1 | 11/2016 | Hench et al. |
| 2017/0167862 A1 | 6/2017 | Dziura et al. |
| 2018/0106735 A1 | 4/2018 | Gellineau et al. |
| 2018/0113084 A1 | 4/2018 | Hench et al. |
| 2018/0328868 A1 | 11/2018 | Bykanov et al. |
| 2019/0017946 A1 | 1/2019 | Wack et al. |
| 2019/0086200 A1 | 3/2019 | Amit |
| 2019/0293578 A1 | 9/2019 | Gellineau |
| 2019/0325571 A1 | 10/2019 | Pandev |

# MEASUREMENT RECIPE OPTIMIZATION BASED ON PROBABILISTIC DOMAIN KNOWLEDGE AND PHYSICAL REALIZATION

CROSS REFERENCE TO RELATED APPLICATION

The present application for patent claims priority under 35 U.S.C. § 119 from U.S. provisional patent application Ser. No. 62/942,730, entitled "Metrology System Utilizing Probabilistic Domain Knowledge and Physical Realization," filed Dec. 2, 2019, the subject matter of which is incorporated herein by reference in its entirety.

TECHNICAL FIELD

The described embodiments relate to metrology systems and methods, and more particularly to methods and systems for improved measurement of semiconductor structures.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical and X-ray based metrology techniques offer the potential for high throughput without the risk of sample destruction. A number of metrology based techniques including scatterometry, reflectometry, and ellipsometry implementations and associated analysis algorithms are commonly used to characterize critical dimensions, film thicknesses, composition, overlay and other parameters of nanoscale structures.

Many metrology techniques are indirect methods of measuring physical properties of a specimen under measurement. In most cases, the raw measurement signals cannot be used to directly determine the physical properties of the specimen. Instead, a measurement model is employed to estimate the values of one or more parameters of interest based on the raw measurement signals. For example, ellipsometry is an indirect method of measuring physical properties of the specimen under measurement. In general, a physics-based measurement model or a machine learning based measurement model is required to determine the physical properties of the specimen based on the raw measurement signals (e.g., ($\alpha_{meas}$ and $\beta_{meas}$).

In some examples, a physics-based measurement model is created that attempts to predict the raw measurement signals (e.g., ($\alpha_{meas}$ and $\beta_{meas}$) based on assumed values of one or more model parameters. As illustrated in equations (1) and (2), the measurement model includes parameters associated with the metrology tool itself, e.g., machine parameters ($P_{machine}$), and parameters associated with the specimen under measurement. When solving for parameters of interest, some specimen parameters are treated as fixed valued ($P_{spec\text{-}fixed}$) and other specimen parameters of interest are floated ($P_{spec\text{-}float}$), i.e., resolved based on the raw measurement signals.

$$\alpha_{model} = f(P_{machine}, P_{spec\text{-}fixed}, P_{spec\text{-}float}) \quad (1)$$

$$\beta_{model} = g(P_{machine}, P_{spec\text{-}fixed}, P_{spec\text{-}float}) \quad (2)$$

Machine parameters are parameters used to characterize the metrology tool (e.g., ellipsometer 101). Exemplary machine parameters include angle of incidence (AOI), analyzer angle ($A_0$), polarizer angle ($P_0$), illumination wavelength, numerical aperture (NA), compensator or waveplate (if present), etc. Specimen parameters are parameters used to characterize the specimen (e.g., material and geometric parameters characterizing the structure(s) under measurement). For a thin film specimen, exemplary specimen parameters include refractive index, dielectric function tensor, nominal layer thickness of all layers, layer sequence, etc. For a CD specimen, exemplary specimen parameters include geometric parameter values associated with different layers, refractive indices associated with different layers, etc. For measurement purposes, the machine parameters and many of the specimen parameters are treated as known, fixed valued parameters. However, the values of one or more of the specimen parameters are treated as unknown, floating parameters of interest.

In some examples, the values of the floating parameters of interest are resolved by an iterative process (e.g., regression) that produces the best fit between theoretical predictions and experimental data. The values of the unknown, floating parameters of interest are varied and the model output values (e.g., $\alpha_{model}$ and $\beta_{model}$) are calculated and compared to the raw measurement data in an iterative manner until a set of specimen parameter values are determined that results in a sufficiently close match between the model output values and the experimentally measured values (e.g., $\alpha_{meas}$ and $\beta_{meas}$). In some other examples, the floating parameters are resolved by a search through a library of pre-computed solutions to find the closest match.

In some other examples, a trained machine learning based measurement model is employed to directly estimate values of parameters of interest based on raw measurement data. In these examples, a machine learning based measurement model takes raw measurement signals as model input and generates values of the parameters of interest as model output.

Both physics based measurement models and machine learning based measurement models must be trained to generate useful estimates of parameters of interest for a particular measurement application. Generally, model training is based on raw measurement signals collected from specimen having known values of the parameters of interest (i.e., Design of Experiments (DOE) data).

A machine learning based measurement model is parameterized by a number of weight parameters. Traditionally, the machine learning based measurement model is trained by a regression process (e.g., ordinary least squares regression). The values of the weight parameters are iteratively adjusted to minimize the differences between the known, reference values of the parameters of interest and values of the parameters of interest estimated by the machine learning based measurement model based on the measured raw measurement signals.

As described hereinbefore, a physics based measurement model is parameterized by a number of machine parameters and specimen parameters. Traditionally, a physics based measurement model is also trained by a regression process (e.g., ordinary least squares regression). One or more of the machine parameters and specimen parameters are iteratively adjusted to minimize the differences between the raw measurement data and the modelled measurement data. For each iteration, the values of the specimen parameters of interest are maintained at the known DOE values.

Traditionally, the training of both machine learning based measurement models and physics based measurement models (a.k.a., measurement recipe generation) is achieved by minimizing total output error; typically expressed as a least squares minimization. Total output error is an expression of total measurement uncertainty; an aggregation of all of the errors arising from the measurement, including precision errors, tool-to-tool matching errors, parameter tracking errors, within wafer variations, etc. Unfortunately, model training based on total measurement uncertainty without control over the components of the total measurement uncertainty leads to suboptimal measurement performance. In many examples, large modeling errors arise, particularly when training is performed based on simulated data due to discrepancies between simulated and real data.

Furthermore, domain knowledge acquired from experience, measurement data, and physics is not directly expressed in the objective function driving the optimization of the measurement model. As a result, domain knowledge is not fully exploited in the measurement recipe development process. Again, this leads to suboptimal measurement performance.

Future metrology applications present challenges for metrology due to increasingly small resolution requirements, multi-parameter correlation, increasingly complex geometric structures, and increasing use of opaque materials. Thus, methods and systems for improved measurement recipe generation are desired.

SUMMARY

Methods and systems for training and implementing metrology recipes based on specific domain knowledge associated with measurement data are presented herein. Domain knowledge includes performance metrics employed to quantitatively characterize the measurement performance of a metrology system in a particular measurement application. Domain knowledge is employed to regularize the optimization process employed during measurement model training, model-based regression, or both.

By way of non-limiting example, probability distributions associated with measurement precision, tool to tool matching, tracking, within wafer variations, etc., are employed to physically regularize the optimization process. In this manner, these important metrics are controlled during measurement model training, model-based regression, or both. The resulting trained measurement models, model-based measurements, or both, provide significant improvement in measurement performance and reliability.

In one aspect, a measurement model is trained based on a physically regularized optimization function. The training is based on measurement data associated with multiple instances of one or more Design of Experiments (DOE) metrology targets disposed on one or more wafers, reference values of parameters of interest associated with the DOE metrology targets, actual measurement data collected from multiple instances of one or more regularization structures disposed on one or more wafers, and measurement performance metrics associated with the actual measurement data.

Furthermore, the one or more measurement performance metrics are employed to regularize the optimization driving the measurement model training process. For example, statistical information characterizing actual measurement data collected from regularization structures, e.g., the known distributions associated with important measurement performance metrics such as measurement precision, wafer mean, etc., are specifically employed to regularize the optimization that drives measurement model training.

In a further aspect, the trained measurement model is employed to estimate values of parameters of interest based on measurements of structures having unknown values of one or more parameters of interest. In some embodiments, the measurement system employed to measure the unknown structures is the same measurement system employed to collect the DOE measurement data. In general, the trained measurement model may be employed to estimate values of parameters of interest based on a single measured spectrum or estimate values of parameters of interest simultaneously based on multiple spectra.

In some embodiments, the regularization structures are the same structures as the DOE metrology targets. However, in general, regularization structures may be different from the DOE metrology targets.

In some embodiments, the actual regularization measurement data is collected by a particular metrology system. In these embodiments, the measurement model is trained for a measurement application involving measurements performed by the same metrology system.

In some other embodiments, the actual regularization measurement data is collected by multiple instances of a metrology system, i.e., multiple metrology systems that are substantially identical. In these embodiments, the measurement model is trained for a measurement application involving measurements performed by any of the multiple instances of the metrology system.

In some examples, the measurement data associated with the measurement of each of the multiple instances of one or more Design of Experiments (DOE) metrology targets by a metrology system is simulated. The simulated data is generated from a parameterized model of the measurement of each of the one or more DOE metrology structures by the metrology system.

In some other examples, the measurement data associated with the multiple instances of one or more Design of Experiments (DOE) metrology targets is actual measurement data collected by a metrology system or multiple instances of a metrology system. In some of these embodiments, the same metrology system or multiple instances of the metrology system is employed to collect the actual regularization measurement data from the regularization structures.

In some embodiments, the physical measurement performance metrics characterize the actual measurement data collected from each of the multiple instances of the one or more regularization structures. In some embodiments the performance metrics are based on historical data, domain knowledge about the processes involved in producing the structure, physics, or a best guess by a user. In some examples, a measurement performance metric is a single point estimate. In other examples, the measurement performance metric is a distribution of estimated values.

In general, the measurement performance metric associated with the measurement data collected from the regularization structures provides information about the values of the physical attributes of the regularization structures. By way of non-limiting example, the physical attributes of the regularization structures includes any of measurement precision, tool to tool matching, wafer mean, within wafer range, tracking to reference, wafer to wafer matching, tracking to wafer split, etc.

In a further aspect, trained measurement model performance is validated with test data using error budget analysis. Real measurement data, simulated measurement data, or both, may be employed as test data for validation purposes. Error budget analysis over real data allows the estimation of the individual contribution of accuracy, tracking, precision, tool matching errors, wafer to wafer consistency, wafer signature consistency, etc. to total error. In some embodiments, test data is designed such that total model error is split into each contributing component.

In another further aspect, the training of a measurement model includes optimization of model hyper-parameters. For example, hyper-parameters for neural network based models include the number and types of neural-network layers, the number of neurons in each layer, optimizer settings, etc. During hyper-parameter optimization multiple models are created and the model with the minimum cost is chosen as the best model.

In another aspect, a model-based regression on a measurement model is physically regularized by on one or more measurement performance metrics. Estimates of one or more parameters of interest are determined based on actual measurement data collected from multiple instances of one or more structures of interest disposed on one or more wafers, statistical information associated with the measurement, and prior estimated values of the parameters of interest.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for training and implementing metrology recipes based on specific domain knowledge associated with measurement data are presented herein. Domain knowledge includes performance metrics employed to quantitatively characterize the measurement performance of a metrology system in a particular measurement application. Domain knowledge is employed to regularize the optimization process employed during measurement model training, model-based regression, or both. In this manner, the optimization process is physically regularized by one or more expressions of the physically based measurement performance metrics. By way of non-limiting example, probability distributions associated with measurement precision, tool to tool matching, tracking, within wafer variations, etc., are employed to physically regularize the optimization process. In this manner, these important metrics are controlled during measurement model training, model-based regression, or both. The resulting trained measurement models, model-based measurements, or both, provide significant improvement in measurement performance and reliability.

Physically regularizing the optimization process employed to train a measurement model using domain knowledge characterizing the training data improves model consistency and reduces the computational effort associated with model training. The optimization process is less sensitive to overfitting. Measurement performance specifications, such as precision, tool to tool matching, and parameter tracking, are more reliably met across different measurement model architectures and measurement applications when physical regularization is employed. In some embodiments, simulated training data is employed. In these embodiments, physical regularization significantly reduces errors due to discrepancies between simulated and real measurement data.

In one aspect, a measurement model is trained based on a physically regularized optimization function. The training is based on measurement data associated with multiple instances of one or more Design of Experiments (DOE) metrology targets disposed on one or more wafers, reference values of parameters of interest associated with the DOE metrology targets, actual measurement data collected from multiple instances of one or more regularization structures disposed on one or more wafers, and measurement performance metrics associated with the actual measurement data. Furthermore, the one or more measurement performance metrics are employed to regularize the optimization driving the measurement model training process.

Figure 1:
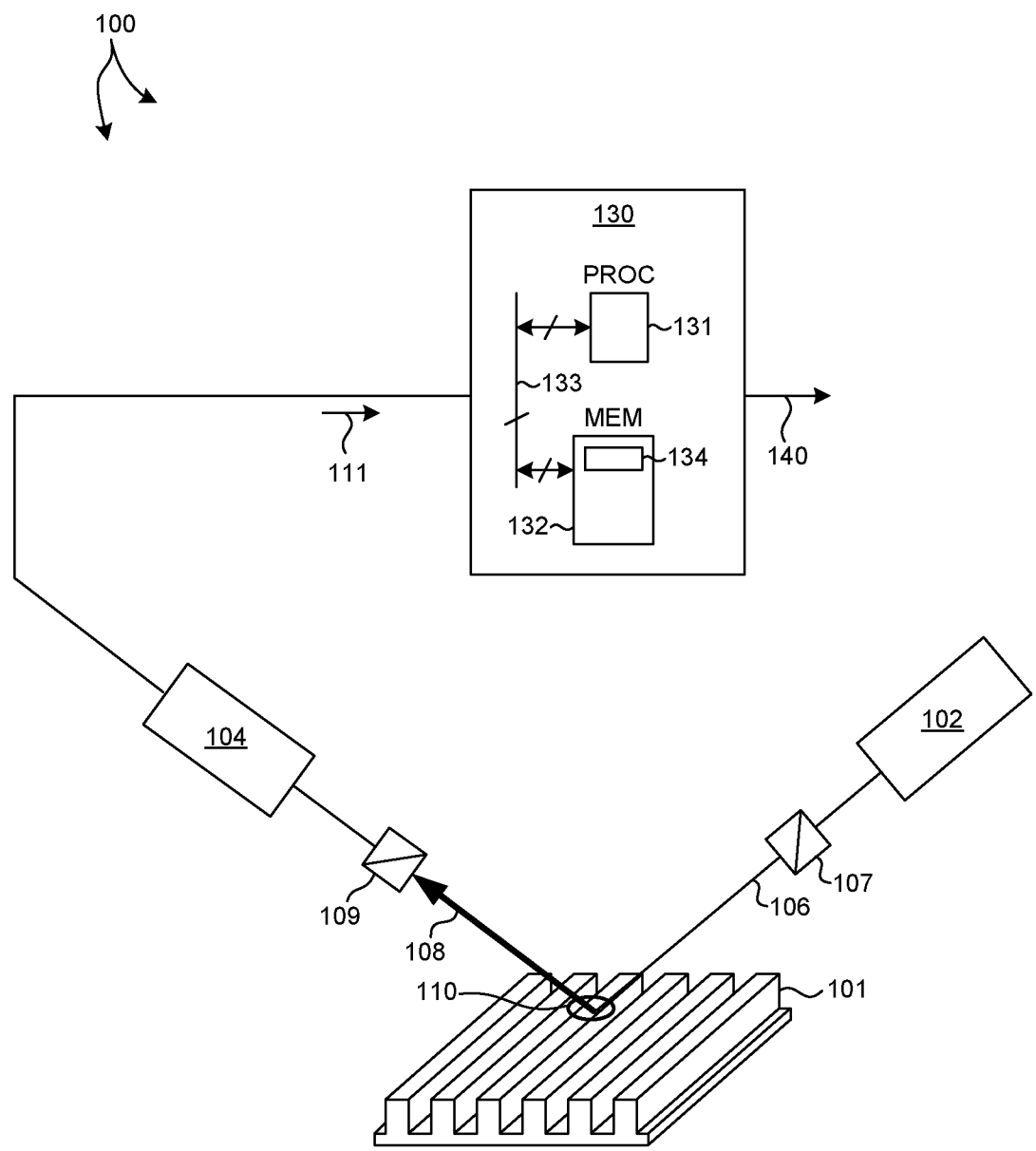
FIG. 1 depicts an illustration of a wafer metrology system 100 for measuring characteristics of a wafer in accordance with the exemplary methods presented herein.

FIG. 1 illustrates a system 100 for measuring characteristics of a specimen in accordance with the exemplary methods presented herein. As shown in FIG. 1, the system 100 may be used to perform spectroscopic ellipsometry measurements of structure 101 depicted in FIG. 1. In this aspect, the system 100 may include a spectroscopic ellipsometer equipped with an illuminator 102 and a spectrometer 104. The illuminator 102 of the system 100 is configured to generate and direct illumination of a selected wavelength range (e.g., 100-2500 nm) to the structure disposed on the surface of the specimen over a measurement spot 110. In turn, the spectrometer 104 is configured to receive illumination reflected from structure 101. It is further noted that the light emerging from the illuminator 102 is polarized using a polarization state generator 107 to produce a polarized illumination beam 106. The radiation reflected by structure 101 is passed through a polarization state analyzer 109 and to the spectrometer 104. The radiation received by the spectrometer 104 in the collection beam 108 is analyzed with regard to polarization state, allowing for spectral analysis by the spectrometer of radiation passed by the analyzer.

These spectra 111 are passed to the computing system 130 for analysis of the structure as described herein.

As depicted in FIG. 1, system 100 includes a single measurement technology (i.e., SE). However, in general, system 100 may include any number of different measurement technologies. By way of non-limiting example, system 100 may be configured as a spectroscopic ellipsometer (including Mueller matrix ellipsometry), a spectroscopic reflectometer, a spectroscopic scatterometer, an overlay scatterometer, an angular resolved beam profile reflectometer, a polarization resolved beam profile reflectometer, a beam profile reflectometer, a beam profile ellipsometer, any single or multiple wavelength ellipsometer, or any combination thereof. Furthermore, in general, measurement data collected by different measurement technologies and analyzed in accordance with the methods described herein may be collected from multiple tools, a single tool integrating multiple technologies, or a combination thereof.

In a further embodiment, system 100 may include one or more computing systems 130 employed to perform measurements of structures based on measurement models developed in accordance with the methods described herein. The one or more computing systems 130 may be communicatively coupled to the spectrometer 104. In one aspect, the one or more computing systems 130 are configured to receive measurement data 111 associated with measurements of a structure under measurement (e.g., structure 101).

Figure 2:
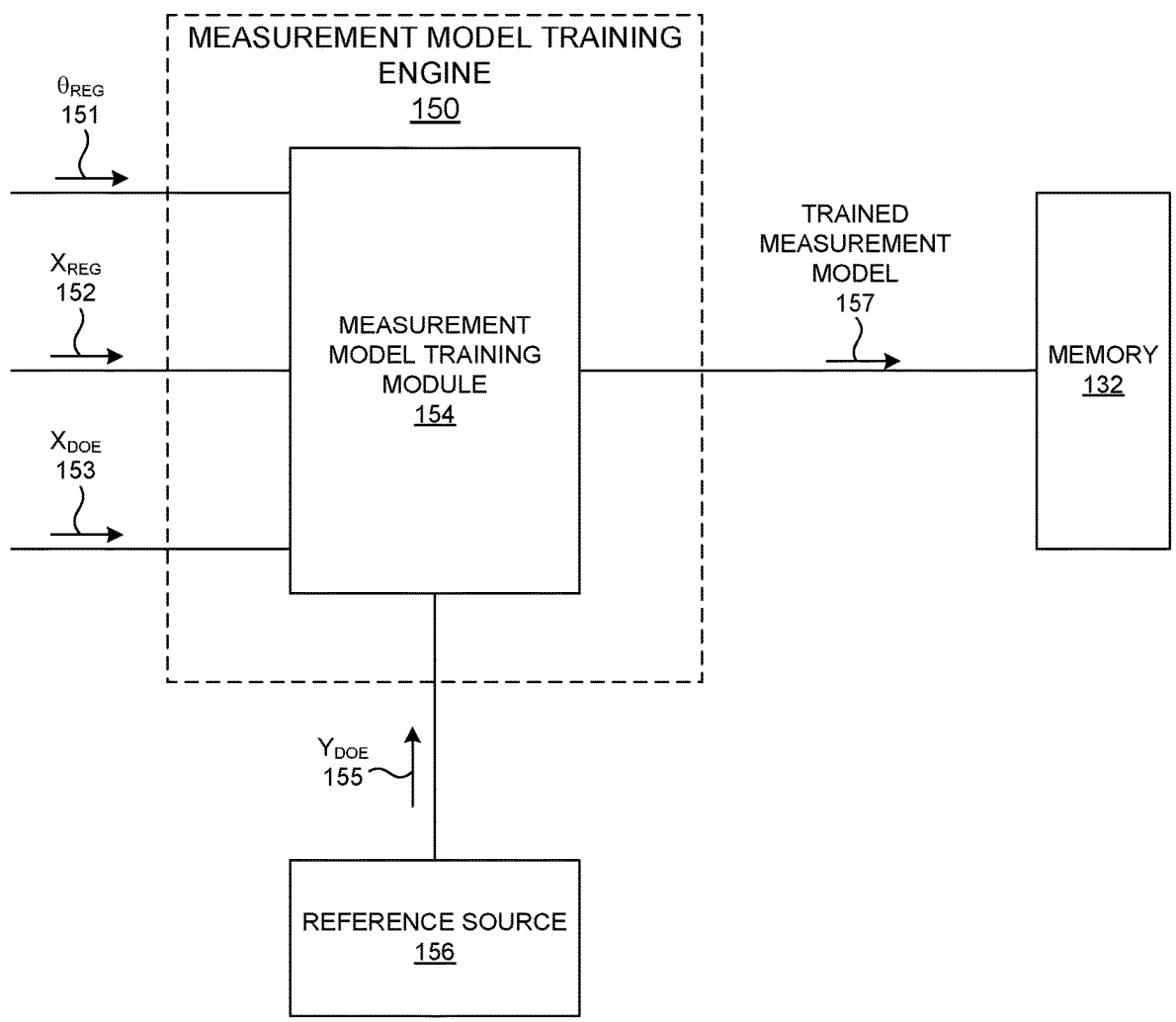
FIG. 2 is a diagram illustrative of an exemplary measurement model training engine 150 in one embodiment.

In one aspect, computing system 130 is configured as a measurement model training engine 150 to train a measurement model based on measurements of regularization structures as described herein. FIG. 2 is a diagram illustrative of an exemplary measurement model training engine 150 in one embodiment. As depicted in FIG. 2, measurement model training engine 150 includes a measurement model training module 154. As depicted in FIG. 2, measurement model training module 154 receives measurement data, $X_{DOE}$ 153, associated with simulated measurements, actual measurements, or both, of multiple instances of one or more Design of Experiments (DOE) metrology targets disposed on one or more wafers. In an example of a spectroscopic ellipsometer measurement, the DOE measurement data includes measured spectra, simulated spectra, or both. In one example, the DOE measurement data 153 includes measured spectra 111 collected by metrology system 100 from multiple instances of one or more DOE metrology targets. In addition, measurement model training module 154 receives reference values of one or more parameters of interest, $Y_{DOE}$ 155, associated with the DOE metrology targets from a reference source 156. Examples of parameters of interest include critical dimensions (CD), overlay, focus, dosage, etc. In some embodiments, the reference values 155 are simulated. In these embodiments, the reference source 156 is a simulation engine that generates the corresponding simulated DOE measurement data 153 for known reference values 156. In some embodiments, the reference values 155 are values measured by a trusted measurement system (e.g., a scanning electron microscope, etc.). In these embodiments, the reference source is the trusted measurement system. Measurement model training module 154 also receives actual regularization measurement data, $X_{REG}$ 152, collected from multiple instances of one or more regularization structures disposed on one or more wafers along with measurement performance metrics, $\theta_{REG}$ 151, associated with the actual regularization measurement data 152. In one example, the regularization measurement data 153 includes measured spectra 111 collected by metrology system 100 from multiple instances of one or more regularization structures.

Measurement model training module 154 trains a measurement model based on an optimization function regularized by the one or more measurement performance metrics. In some examples, the measurement model is a neural network model. In some examples, each measurement performance metric is represented as a separate distribution. In one example, the distribution of measurement precision associated with the regularization structures is an inverse gamma distribution. Equation (1) illustrates a probability density function, p, for measurement precision dataset, x, where, $\Gamma(\cdot)$, denotes the gamma function, the constant, a, denotes a shape parameter, and the constant, b, denotes a scale parameter.

$$p(x; a, b) = \frac{b^a x^{-a-1}}{\Gamma(a)} \exp\left(-\frac{b}{x}\right) \quad (1)$$

In another example, the distribution of mean values of instances of a measured regularization structure over a wafer is described by a normal distribution. Equation (2) illustrates a probability density function, m, for measurement wafer mean dataset, x, where, $\mu$, denotes a specific mean and, $\sigma$, denotes a specific variance associated with the distribution.

$$m(x; \mu, \sigma^2) = \frac{1}{\sqrt{2\pi\sigma^2}} \exp - \frac{(x-\mu)^2}{2\sigma^2} \quad (2)$$

In a further aspect, the statistical information characterizing actual measurement data collected from regularization structures, e.g., the known distributions associated with important measurement performance metrics such as measurement precision, wafer mean, etc., are specifically employed to regularize the optimization that drives measurement model training. Equation (3) illustrates the joint likelihood of DOE parameters of interest, $y_{DOE}$ along with the measurement performance metrics, criteria$_{reg}$, associated with measurements of regularization structures. By maximizing the joint likelihood, the measurement model, $h(\cdot)$ evolves during training to maintain fidelity on DOE measurement data, $X_{DOE}$, while adapting to satisfy the measurement performance on measurement data associated with the regularization structures, $x_{reg}$.

$$P(y_{DOE}, \text{criteria}_{reg} | h(\cdot), x_{DOE}, x_{reg}) \quad (3)$$

To maximize the joint likelihood, the DOE measurement data contributes to mean squared errors and measurement data associated with the regularization structures contribute as regularization terms in the loss function. In summary, maximizing the joint likelihood is equivalent to the minimization of the loss function illustrated in Equation (4) assuming independence between DOE measurement data and regularization data as well as among different regularization datasets, where $\text{Reg}(h(\cdot))$ is the generic regularization for model parameters weighted by constant parameter, $\alpha$, $\text{Reg}_k (x_{reg,k}, h(\cdot), \theta_{reg,k})$ is the kth regularization term weighted by constant parameter, $\gamma_k$, where $x_{reg,k}$ is the kth regularization data set and $\theta_{reg,k}$ is the vector of parameters describing the statistical information associated with the actual measurement data collected from the regularization structures.

$$J(h(\cdot); x, y, \theta) = \|h(x_{DOE}) - y_{DOE}\|^2 + \alpha \cdot Reg(h(\cdot)) + \quad (4)$$
$$\gamma_1 \cdot Reg_1(x_{reg,1}, h(\cdot), \theta_{reg,1}) + \ldots + \gamma_k \cdot Reg_k(x_{reg,k}, h(\cdot), \theta_{reg,k})$$

In one example, a measurement model optimization employs two different regularization terms, $Reg_1$ and $Reg_2$. $Reg_1$ represents regularization of measurement precision on measurement precision datasets, $x_{reg\text{-}prec}$, and $Reg_2$ represents regularization of wafer mean on within wafer datasets, $x_{WIW}$. By way of non-limiting example, we assume that measurement precision is described by an inverse Gamma distribution with shape parameter $a_{\sigma_P}$ and scale parameter $b_{\sigma_P}$ and we assume that wafer mean is described by a normal distribution with mean $\mu_{WiW}$ and variance $\sigma^2_{WiW}$. With these assumptions, regularization term, $Reg_1$, can be written as illustrated in equation (5), where $\theta_{reg\text{-}prec} = \{a_{\sigma_P}, b_{\sigma_P}\}$ and $\sigma(h(x_{reg\text{-}prec}))$ denotes the standard deviation of $h(x_{reg\text{-}prec})$.

$$Reg_1(x_{reg-prec}, h(\cdot), \theta_{reg-prec}) = \quad (5)$$
$$(1 + a_{\sigma_P})\log[\sigma(h(x_{reg-prec}))] - \frac{b_{\sigma_P}}{\log[\sigma(h(x_{reg-prec}))]}$$

Similarly, regularization term, $Reg_2$, can be written as illustrated in equation (6), where $\theta_{reg\text{-}WiW} = \{\mu_{WiW}, \sigma_{WiW}^2\}$ and $\overline{h(x_{WiW})}$ denotes the wafer mean.

$$Reg_2(x_{reg-WiW}, h(\cdot), \theta_{reg-WiW}) = \frac{1}{2\sigma^2_{WiW}}(\overline{h(x_{W1W})} - \mu_{WiW})^2 \quad (6)$$

In this example, the measurement model optimization function can be written as illustrated in equation (7), where $h_{w,b}(\cdot)$ is a neural network model having weighting values, W, and bias values, b, model error variance, $\sigma_D^2$, and weight variance, $\sigma_W^2$.

$$J(h_{W,b}(\cdot); x, y, \theta) = \frac{1}{2\sigma_D^2}\|h_{W,b}(x_{DOE}) - y_{DOE}\|^2 + \quad (7)$$
$$\frac{1}{2\sigma_W^2}\|W\|^2 + (1 + a_{\sigma_P})\log[\sigma(h_{W,b}(x_{reg-prec}))] -$$
$$\frac{b_{\sigma_P}}{\log[\sigma(h_{W,b}(x_{reg-prec}))]} + \frac{1}{2\sigma^2_{WiW}}(\overline{h_{W,b}(x_{W1W})} - \mu_{WiW})^2$$

The DOE datasets, measurement precision datasets, and wafer mean datasets employed for model training using the measurement model optimization function are illustrated in equation (8).

$$\{x, y\} = \{(x_{DOE}^{(1)}, y_{DOE}^{(1)}), \ldots, (x_{DOE}^{(n_s)}, y_{DOE}^{(n_s)})\}, \quad (8)$$
$$\{x_{reg-prec}^{(1)}, \ldots, x_{reg-prec}^{(n_{prec})}\},$$
$$\{x_{reg-WiW}^{(1)}, \ldots, x_{reg-WiW}^{(n_{WiW})}\}$$

The known parameters of statistical models describing model error, neural network weight values, measurement precision, and wafer mean within wafer are illustrated in equation (9).

$$\theta = \{\sigma_D^2, \sigma_W^2, a_{\sigma_P}, b_{\sigma_P}, \mu_{WiW}, \sigma_{WiW}^2\} \quad (9)$$

During model training, the optimization function illustrated by equation (7) balances between the DOE data estimation errors and all other criteria. The first term expresses the DOE data estimation error as a mean squared error penalized by the model error variance, $\sigma_D^2$. The second term is a generic regularizer for the model weights, W. The model weights, W, are penalized by the weight variance, $\sigma_W^2$. The last two terms regularize the optimization for measurement precision and wafer mean as described hereinbefore.

At each iteration, the optimization function drives changes to the weighting values, W, and bias values, b, of the neural network model, $h_{W,b}(\cdot)$ that minimize the optimization function. When the optimization function reaches a sufficiently low value, the measurement model is considered trained, and the trained measurement model 157 is stored in memory (e.g., memory 132).

In another further aspect, the trained measurement model is employed to estimate values of parameters of interest based on measurements of structures having unknown values of one or more parameters of interest. In some examples, the trained model provides both an estimate of the value of parameter of interest and the uncertainty of the measured value. The trained measurement model is employed to estimate values of one or more parameters of interest from actual measurement data (e.g., measured spectra) collected by the measurement system (e.g., metrology system 100). In some embodiments, the measurement system is the same measurement system employed to collect the DOE measurement data. In other embodiments, the measurement system is the system simulated to generate the DOE measurement data synthetically. In one example, the actual measurement data includes measured spectra 111 collected by metrology system 100 from one or more metrology targets having unknown values of the one or more parameters of interest.

In general, the trained measurement model may be employed to estimate values of parameters of interest based on a single measured spectrum or estimate values of parameters of interest simultaneously based on multiple spectra.

In some embodiments, the regularization structures are the same structures as the DOE metrology targets. However, in general, regularization structures may be different from the DOE metrology targets.

In some embodiments, the actual regularization measurement data collected from the multiple instances of the one or more regularization structures is collected by a particular metrology system. In these embodiments, the measurement model is trained for a measurement application involving measurements performed by the same metrology system.

In some other embodiments, the actual regularization measurement data collected from the multiple instances of the one or more regularization structures is collected by multiple instances of a metrology system, i.e., multiple metrology systems that are substantially identical. In these embodiments, the measurement model is trained for a measurement application involving measurements performed by any of the multiple instances of the metrology system.

In some examples, the measurement data associated with the measurement of each of the multiple instances of one or more Design of Experiments (DOE) metrology targets by a metrology system is simulated. The simulated data is generated from a parameterized model of the measurement of each of the one or more DOE metrology structures by the metrology system.

In some other examples, the measurement data associated with the multiple instances of one or more Design of Experiments (DOE) metrology targets is actual measurement data collected by a metrology system or multiple instances of a metrology system. In some of these embodiments, the same metrology system or multiple instances of the metrology system is employed to collect the actual regularization measurement data from the regularization structures.

In some embodiments, the physical measurement performance metrics characterize the actual measurement data collected from each of the multiple instances of the one or more regularization structures. In some embodiments the performance metrics are based on historical data, domain knowledge about the processes involved in producing the structure, physics, or a best guess by a user. In some examples, a measurement performance metric is a single point estimate. In other examples, the measurement performance metric is a distribution of estimated values.

In general, the measurement performance metric associated with the measurement data collected from the regularization structures provides information about the values of the physical attributes of the regularization structures. By way of non-limiting example, the physical attributes of the regularization structures includes any of measurement precision, tool to tool matching, wafer mean, within wafer range, tracking to reference, wafer to wafer matching, tracking to wafer split, etc.

In some examples, a measurement performance metric includes specific values of a parameter of a regularization structure and corresponding uncertainties at specific locations on the wafer. In one example, the measurement performance metric is a critical dimension (CD) at a particular location on a wafer and its uncertainty, e.g., the CD is 35 nanometers +/−0.5 nanometers.

In some examples, a measurement performance metric includes a probability distribution of values of a parameter of a structure within a wafer, within a lot of wafers, or across multiple wafer lots. In one example, the CD has a normal distribution with a mean value and a standard deviation, e.g., mean value of CD is 55 nanometers and the standard deviation is 2 nanometers.

In some examples, a measurement performance metric includes a spatial distribution of values of a parameter of interest across a wafer, e.g., a wafer map, and the corresponding uncertainties at each location.

In some examples, a measurement performance metric includes distributions of measured values of parameters of interest across multiple tools to characterize tool to tool matching. The distributions may represent mean values across each wafer, values at each site, or both.

In some examples, a measurement performance metric includes a distribution of measurement precision errors.

In some examples, a measurement performance metric includes a wafer map matching estimates across wafer lots.

In some examples, a measurement performance metric includes one or metrics characterizing the tracking of estimated values of a parameter of interest with reference values of the parameter of interest. In some examples, the metrics characterizing tracking performance include any of an $R^2$ value, a slope value, and an offset value.

In some examples, a measurement performance metric includes one or more metrics characterizing the tracking of estimated values of a parameter of interest to wafer mean for a DOE split experiment. In some examples, the metrics characterizing tracking performance include any of an $R^2$ value, a slope value, and an offset value.

Figure 4:
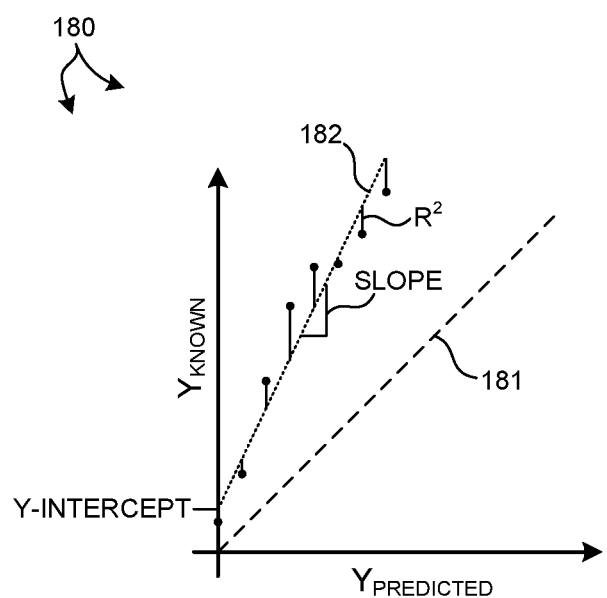
FIG. 4 is a plot illustrative of metrics characterizing measurement tracking performance.

FIG. 4 illustrates a plot 180 indicative of metrics characterizing tracking performance. As illustrated in FIG. 4, the x-location of each data point on plot 180 indicates the predicted value of a parameter of interest and the y-location of each data point indicates the known value (e.g., DOE reference value) of the parameter of interest. Ideal tracking performance is indicated by dashed line 181. If all predicted values perfectly matched the corresponding known, trusted values, all data points would lie on line 181. However, in practice, tracking performance is not perfect. Line 182 illustrates a best fit line to the data points. As depicted in FIG. 4, line 182 is characterized by slope and a y-intercept values, and the correlation between the known and predicted values is characterized by the $R^2$ value.

In a further aspect, trained measurement model performance is validated with test data using error budget analysis. Real measurement data, simulated measurement data, or both, may be employed as test data for validation purposes.

Error budget analysis over real data allows the estimation of the individual contribution of accuracy, tracking, precision, tool matching errors, wafer to wafer consistency, wafer signature consistency, etc. to total error. In some embodiments, test data is designed such that total model error is split into each contributing component.

By way of non-limiting example, real data includes any of the following subsets: real data with reference values for accuracy and tracking calculations. Reference values include slope, offset, $R^2$, 3STEYX, mean squared error, 3 sigma error, etc.; real data from measurements of the same site measured multiple times to estimate measurement precision; real data from measurements of the same site measured by different tools to estimate tool-to-tool matching; real data from measurement of sites on multiple wafers to estimate wafer to wafer changes of wafer mean and wafer variance; and real data measurements of multiple wafers to identify wafer signatures, e.g., typical wafer patterns like a bullseye pattern that is expected to be present for given wafers.

In some other examples, a parametrized model of the structure is employed to generate simulated data for error budget analysis. Simulated data is generated such that each parameter of the structure is sampled within its DOE while other parameters are fixed at nominal values. In some examples, other parameters of the simulation, e.g., system model parameters, are included in an error budget analysis. The true reference values of a parameter are known with simulated data, so errors due to changes of each parameter of the structure can be separated.

In some examples, additional simulated data is generated with different noise sampling to calculate precision error.

In some examples, additional simulated data is generated outside of the DOE of the parametrized structure to estimate extrapolation errors.

In another further aspect, the training of a measurement model includes optimization of model hyper-parameters. For example, hyper-parameters for neural network based models include the number and types of neural-network layers, the number of neurons in each layer, optimizer settings, etc. During hyper-parameter optimization multiple models are created and the model with the minimum cost is chosen as the best model.

In general, multiple models created during hyper-parameter optimization may have similar total cost but the costs associated with each different performance metric and associated regularization term may be very different. Error budget analysis is applied to separate the errors and the optimization described herein provides flexibility to weight differently the contribution of each performance metric, allowing a user to choose the model that best suits user criteria.

Figure 3A:
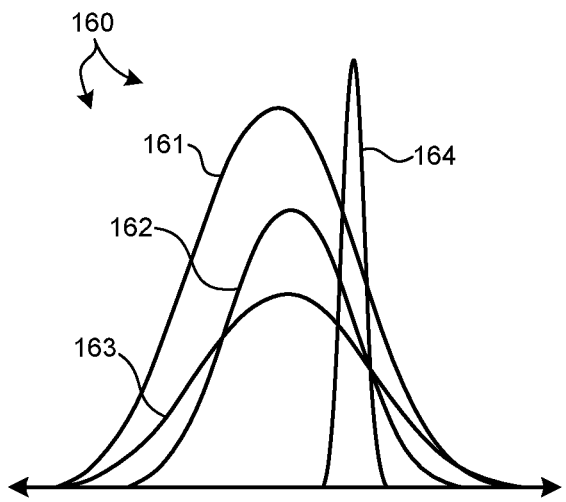
FIGS. 3A-C are plots indicative of the distribution of errors associated with measurement models having different hyperparameters.
Figure 3B:
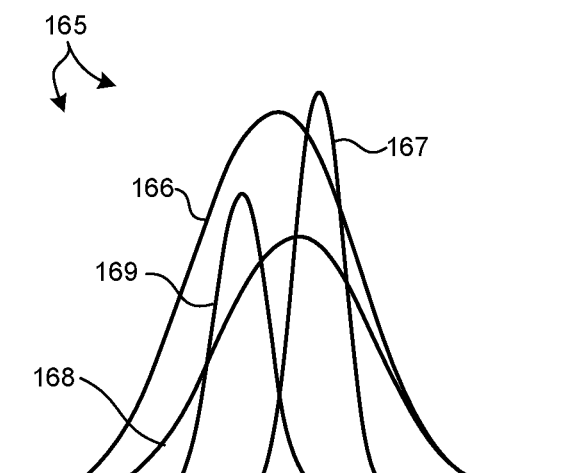
Figure 3C:
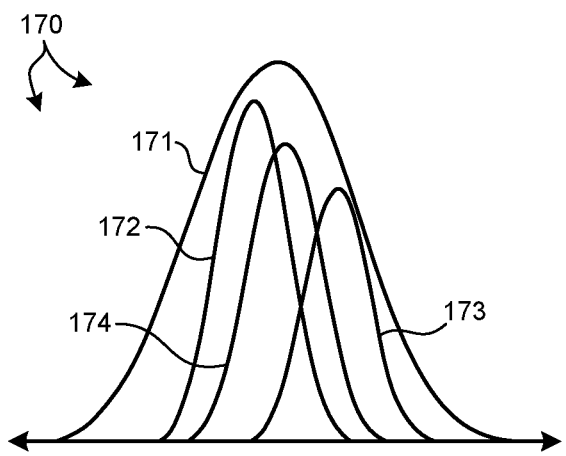

For example, FIGS. 3A-3C depict different models having the same total cost, but different accuracy, precision, and tool matching performance. FIG. 3A depicts a plot 160 indicative of the distribution of errors associated with a measurement model. Plotline 161 illustrates total cost. Plotline 162 illustrates tool matching error, plotline 163 illustrates accuracy error, and plotline 164 illustrates precision error. FIG. 3B depicts a plot 165 indicative of the distribution of errors associated with a measurement model having different hyperparameters. Plotline 166 illustrates total cost. Plotline 167 illustrates tool matching error, plotline 168 illustrates accuracy error, and plotline 169 illustrates precision error. FIG. 3C depicts a plot 170 indicative of the distribution of errors associated with yet another measurement model having different hyperparameters. Plotline 171 illustrates total cost. Plotline 172 illustrates tool matching error, plotline 173 illustrates accuracy error, and plotline 174 illustrates precision error. As illustrated in FIGS. 3A-C, the total cost of all three measurement models is the same, but the magnitudes of the error components are different. For example, if a user wants to balance the contributions of each error component, the measurement model associated with FIG. 3C is the best selection.

In another aspect, a model-based regression on a measurement model is physically regularized by on one or more measurement performance metrics. Estimates of one or more parameters of interest are determined based on actual measurement data collected from multiple instances of one or more structures of interest disposed on one or more wafers, statistical information associated with the measurement, and prior estimated values of the parameters of interest.

Figure 5:
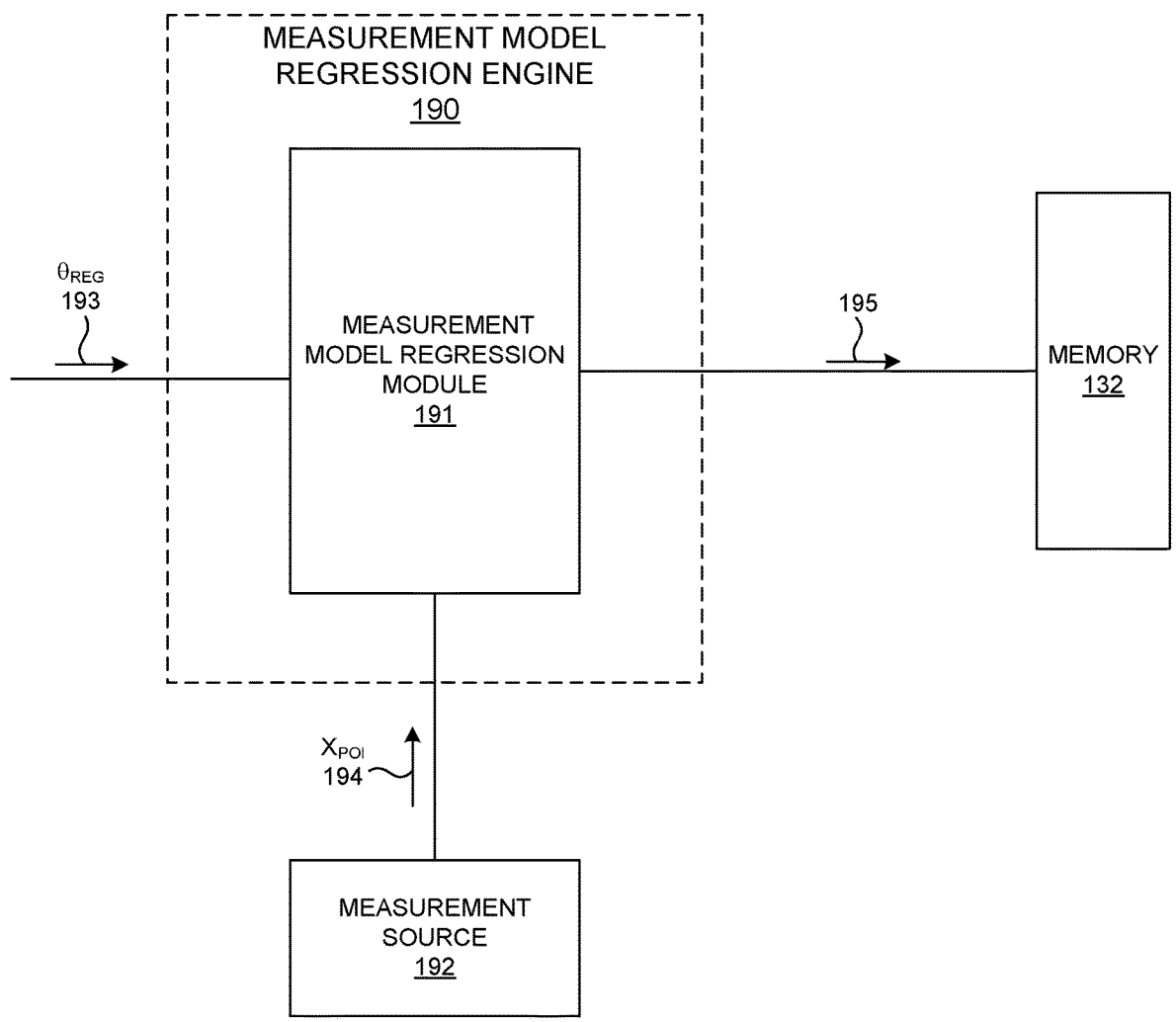
FIG. 5 is a diagram illustrative of an exemplary measurement model regression engine 190 in one embodiment.

In one aspect, computing system 130 is configured as a measurement model regression engine to perform measurements of structures as described herein. FIG. 5 is a diagram illustrative of an exemplary measurement model regression engine 190 in one embodiment. As depicted in FIG. 5, measurement model regression engine 190 includes a measurement model regression module 191. As depicted in FIG. 5, measurement model regression module 191 receives measurement data, $X_{POI}$ 194, associated with measurements of one or more metrology targets from a measurement source 192, e.g., a spectroscopic ellipsometer, etc. In one example, the measurement data 194 includes measured spectra 111 collected by metrology system 100 from one or more metrology targets. In addition, measurement model training module 191 receives measurement performance metrics, $\theta_{REG}$ 193, associated with the measurement data 194.

Measurement model regression module 191 estimates values of one or more parameters of interest 195 associated with the measured metrology targets based on an optimization function regularized by the one or more measurement performance metrics. The estimated values of the parameters of interest 195 are stored in a memory (e.g., memory 132).

The loss function of regression includes a data reconstruction error term and one or more regularization terms. Equation (10) illustrates an exemplary loss function of a model based regression to estimate values of one or more parameters of interest from actual measurements.

$$J(Y;X,\theta) = \|g(Y)-X\|_\Sigma^2 + \gamma_1 \cdot Reg_1(Y_1,\theta_1) + \ldots + \gamma_k \cdot Reg_k(Y_k,\theta_k) \quad (10)$$

The first term of the loss function is a reconstruction error that measures the difference between the real measurement data, X, and the simulated measurement data, g(Y), where g(·) is the known measurement simulation model that estimates measured spectra from a current estimated value of one or more parameters of interest, Y. In the example illustrated in equation (10), the reconstruction error term is weighted by the inverse of the noise covariance matrix, Σ. The regularization terms evaluate how well the measurement performance metrics are met based on known parameters of models describing each measurement performance metric and prior estimated values of the one or more parameters of interest. Each dataset, $X_k$, is a subset of data X with corresponding measurement information, $\theta_k$, and estimated parameters, $Y_k$. The goal for the regression is to find the values of the one or more parameters of interest that minimizes the loss function. During regression, the parameter, Y, is adjusted to reduce the mismatch between simulated data and real data as well as satisfying the measurement performance metrics given the prior information.

In one example, the regularization terms are measurement precision and wafer mean within wafer as described hereinbefore. In this example, the regularization term associated with measurement precision is illustrated in equation (11), where $Y_{reg-prec}$ is the prior estimated values of the parameter of interest and $\sigma(Y_{reg-prec})$ denotes the standard deviation of $Y_{reg-prec}$.

$$\gamma_1 \cdot Reg_1(Y_1, \theta_1) = (1 + a_{\sigma_P})\log[\sigma(Y_{reg-prec})] - \frac{b_{\sigma_P}}{\log[\sigma(Y_{reg-prec})]} \quad (11)$$

The regularization term associated with wafer mean within wafer precision is illustrated in equation (12), where $\overline{Y_{WiW}}$ is the prior estimated mean values of the parameter of interest within the wafer.

$$\gamma_2 \cdot Reg_2(Y_2, \theta_2) = \frac{1}{2\sigma_{WiW}^2}(\overline{Y_{WiW}} - \mu_{WiW})^2 \quad (12)$$

In this example, the loss function is illustrated by equation (13).

$$J(Y; X, \theta) = \|g(Y) - X\|_\Sigma^2 + (1 + a_{\sigma_P})\log[\sigma(Y_{prec})] - \frac{b_{\sigma_P}}{\log[\sigma(Y_{prec})]} + \frac{1}{2\sigma_{WiW}^2}(\overline{Y_{WiW}} - \mu_{WiW})^2 \quad (13)$$

In some embodiments, values of parameters of interest employed to train a measurement model are derived from measurements of DOE wafers by a reference metrology system. The reference metrology system is a trusted measurement system that generates sufficiently accurate measurement results. In some examples, reference metrology systems are too slow to be used to measure wafers on-line as part of the wafer fabrication process flow, but are suitable for off-line use for purposes such as model training. By way of non-limiting example, a reference metrology system may include a stand-alone optical metrology system, such as a spectroscopic ellipsometer (SE), SE with multiple angles of illumination, SE measuring Mueller matrix elements, a single-wavelength ellipsometer, a beam profile ellipsometer, a beam profile reflectometer, a broadband reflective spectrometer, a single-wavelength reflectometer, an angle-resolved reflectometer, an imaging system, a scatterometer, such as a speckle analyzer, an X-ray based metrology system such as a small angle x-ray scatterometer (SAXS) operated in a transmission or grazing incidence mode, an x-ray diffraction (XRD) system, an x-ray fluorescence (XRF) system, an x-ray photoelectron spectroscopy (XPS) system, an x-ray reflectometer (XRR) system, a Raman spectroscopy system, an atomic force microscopy (AFM) system, a transmission electron microscopy system, a scanning electron microscopy system, or other technologies capable of determining device geometry.

In some embodiments, a measurement model trained as described herein is implemented as a neural network model. In other examples, a measurement model may be implemented as a linear model, a non-linear model, a polynomial model, a response surface model, a support vector machines model, a random forest model, a deep network model, a convolutional network model, or other types of models. In some examples, a measurement model trained as described herein may be implemented as a combination of models.

In yet another further aspect, the measurement results described herein can be used to provide active feedback to a process tool (e.g., lithography tool, etch tool, deposition tool, etc.). For example, values of measured parameters determined based on measurement methods described herein can be communicated to an etch tool to adjust the etch time to achieve a desired etch depth. In a similar way etch parameters (e.g., etch time, diffusivity, etc.) or deposition parameters (e.g., time, concentration, etc.) may be included in a measurement model to provide active feedback to etch tools or deposition tools, respectively. In some example, corrections to process parameters determined based on measured device parameter values and a trained measurement model may be communicated to the process tool. In one embodiment, computing system 130 determines values of one or more parameters of interest during process based on measured signals 111 received from a measurement system. In addition, computing system 130 communicates control commands to a process controller (not shown) based on the determined values of the one or more parameters of interest. The control commands cause the process controller to change the state of a process (e.g., stop the etch process, change the diffusivity, change lithography focus, change lithography dosage, etc.).

In some embodiments, the methods and systems for metrology of semiconductor devices as described herein are applied to the measurement of memory structures. These embodiments enable optical critical dimension (CD), film, and composition metrology for periodic and planar structures.

In some examples, the measurement models are implemented as an element of a SpectraShape® optical critical-dimension metrology system available from KLA-Tencor Corporation, Milpitas, Calif., USA. In this manner, the model is created and ready for use immediately after the spectra are collected by the system.

In some other examples, the measurement models are implemented off-line, for example, by a computing system implementing AcuShape® software available from KLA-Tencor Corporation, Milpitas, Calif., USA. The resulting, trained model may be incorporated as an element of an AcuShape® library that is accessible by a metrology system performing measurements.

Figure 6:
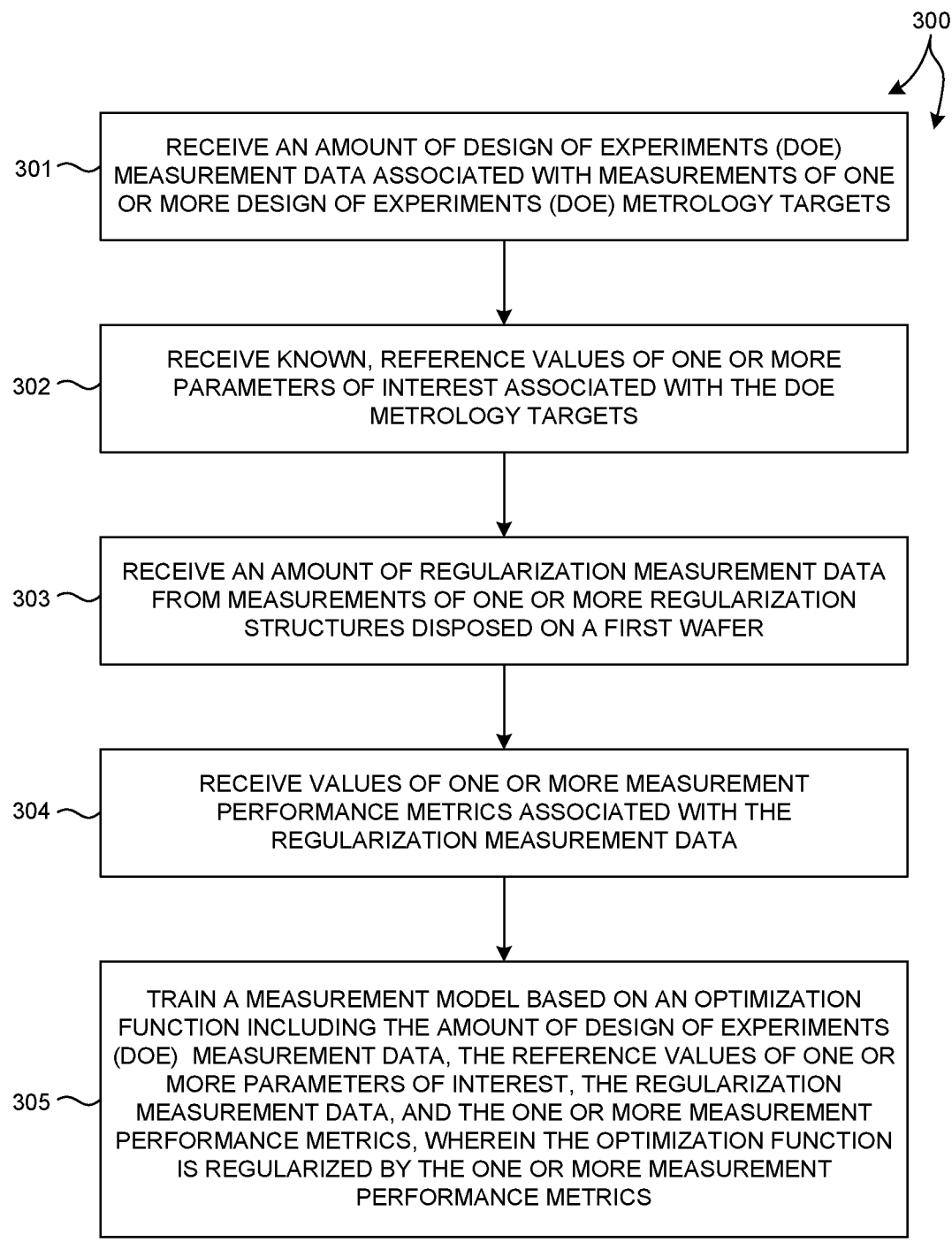
FIG. 6 illustrates a flowchart of a method 300 for training a measurement model for estimating values of parameters of interest based on specific domain knowledge associated with measurement data.

FIG. 6 illustrates a method 300 of training a measurement model based on one or more metrology performance metrics in at least one novel aspect. Method 300 is suitable for implementation by a metrology system such as metrology system 100 illustrated in FIG. 1 of the present invention. In one aspect, it is recognized that data processing blocks of method 300 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 301, an amount of Design of Experiments (DOE) measurement data associated with measurements of one or more Design of Experiments (DOE) metrology targets is received by a computing system.

In block 302, known, reference values of one or more parameters of interest associated with the DOE metrology targets are received by the computing system.

In block 303, an amount of regularization measurement data from measurements of one or more regularization structures disposed on a first wafer by a metrology tool is received by the computing system.

In block 304, values of one or more measurement performance metrics associated with the regularization measurement data are received by the computing system.

In block 305, a measurement model is trained based on an optimization function including the amount of Design of Experiments (DOE) measurement data, the reference values of one or more parameters of interest, the regularization measurement data, and the one or more measurement performance metrics. The optimization function is regularized by the one or more measurement performance metrics.

Figure 7:
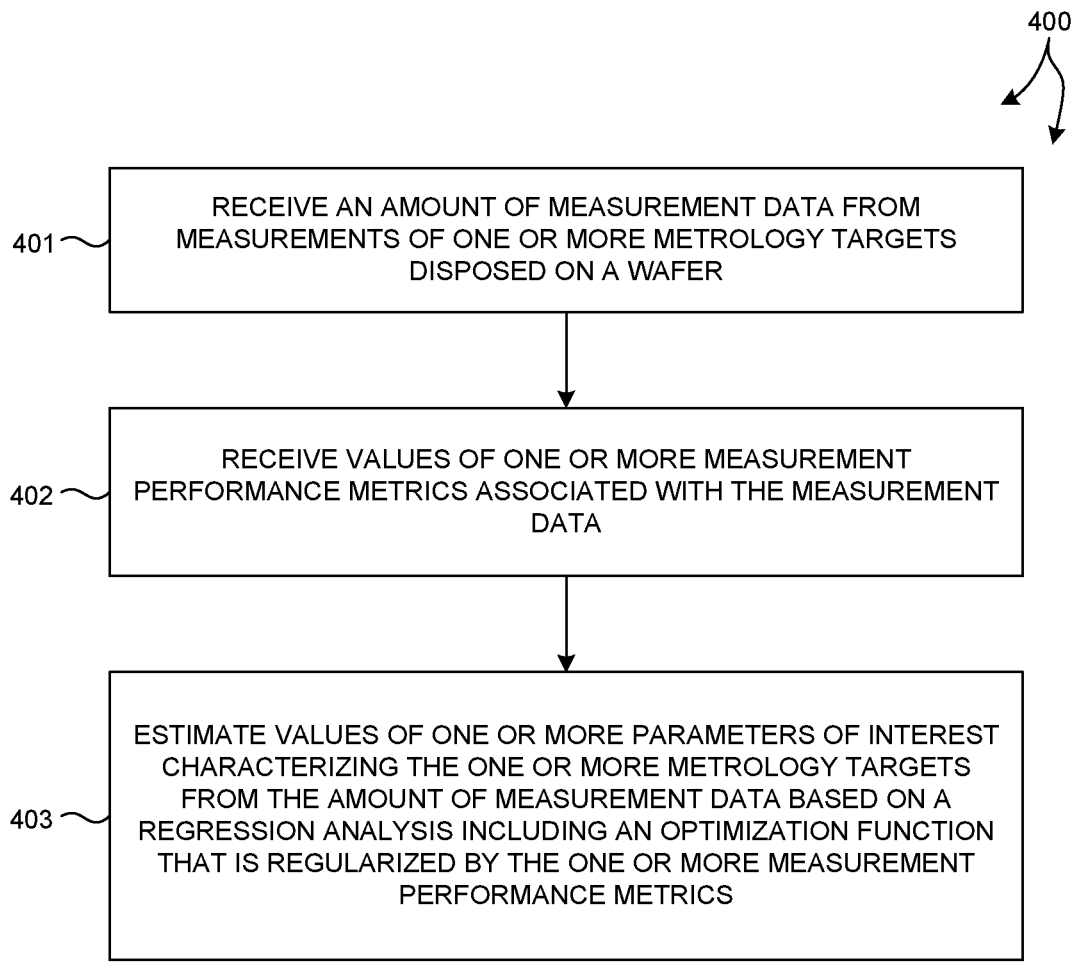
FIG. 7 illustrates a flowchart of a method 400 for performing regression on a measurement model based on specific domain knowledge associated with measurement data to estimate values of parameters of interest.

FIG. 7 illustrates a method 400 of estimating values of one or more parameters of interest based on an optimization function regularized by on one or more metrology performance metrics in at least one novel aspect. Method 400 is suitable for implementation by a metrology system such as metrology system 100 illustrated in FIG. 1 of the present invention. In one aspect, it is recognized that data processing blocks of method 400 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 401, an amount of measurement data from measurements of one or more metrology targets disposed on a wafer by a metrology tool is received by a computing system.

In block 402, values of one or more measurement performance metrics associated with the measurement data are received by the computing system.

In block 403, values of one or more parameters of interest characterizing the one or more metrology targets are estimated from the amount of measurement data based on a regression analysis including an optimization function that is regularized by the one or more measurement performance metrics.

In a further embodiment, system 100 includes one or more computing systems 130 employed to perform measurements of semiconductor structures based on spectroscopic measurement data collected in accordance with the methods described herein. The one or more computing systems 130 may be communicatively coupled to one or more spectrometers, active optical elements, process controllers, etc. In one aspect, the one or more computing systems 130 are configured to receive measurement data associated with spectral measurements of structures of wafer 101.

It should be recognized that one or more steps described throughout the present disclosure may be carried out by a single computer system 130 or, alternatively, a multiple computer system 130. Moreover, different subsystems of system 100 may include a computer system suitable for carrying out at least a portion of the steps described herein. Therefore, the aforementioned description should not be interpreted as a limitation on the present invention but merely an illustration.

In addition, the computer system 130 may be communicatively coupled to the spectrometers in any manner known in the art. For example, the one or more computing systems 130 may be coupled to computing systems associated with the spectrometers. In another example, the spectrometers may be controlled directly by a single computer system coupled to computer system 130.

The computer system 130 of system 100 may be configured to receive and/or acquire data or information from the subsystems of the system (e.g., spectrometers and the like) by a transmission medium that may include wireline and/or wireless portions. In this manner, the transmission medium may serve as a data link between the computer system 130 and other subsystems of system 100.

Computer system 130 of system 100 may be configured to receive and/or acquire data or information (e.g., measurement results, modeling inputs, modeling results, reference measurement results, etc.) from other systems by a transmission medium that may include wireline and/or wireless portions. In this manner, the transmission medium may serve as a data link between the computer system 130 and other systems (e.g., memory on-board system 100, external memory, or other external systems). For example, the computing system 130 may be configured to receive measurement data from a storage medium (i.e., memory 132 or an external memory) via a data link. For instance, spectral results obtained using the spectrometers described herein may be stored in a permanent or semi-permanent memory device (e.g., memory 132 or an external memory). In this regard, the spectral results may be imported from on-board memory or from an external memory system. Moreover, the computer system 130 may send data to other systems via a transmission medium. For instance, a measurement model or an estimated parameter value determined by computer system 130 may be communicated and stored in an external memory. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor measurement system that may be used for measuring a specimen within any semiconductor processing tool (e.g., an inspection system or a lithography system). The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A system comprising:
    a metrology tool including an illumination source and a detector configured to collect an amount of regularization measurement data from measurements of one or more regularization structures disposed on a first wafer; and
    a computing system configured to:
    receive an amount of Design of Experiments (DOE) measurement data associated with measurements of one or more Design of Experiments (DOE) metrology targets;
    receive known, reference values of one or more parameters of interest associated with the DOE metrology targets;
    receive the regularization measurement data;
    receive values of one or more measurement performance metrics associated with the regularization measurement data; and
    train a measurement model based on an optimization function including the amount of Design of Experiments (DOE) measurement data, the reference values of one or more parameters of interest, the regularization measurement data, and the one or more measurement performance metrics, wherein the optimization function is regularized by the one or more measurement performance metrics.

2. The system of claim 1, wherein at least a portion of the amount of Design of Experiments (DOE) measurement data associated with measurements of one or more Design of Experiments (DOE) metrology targets is generated by a simulation.

3. The system of claim 2, wherein the reference values of one or more parameters of interest associated with the DOE metrology targets are known values associated with the simulation.

4. The system of claim 1, wherein the reference values of one or more parameters of interest associated with the DOE metrology targets are measured by a trusted, reference metrology system.

5. The system of claim 1, wherein at least a portion of the amount of Design of Experiments (DOE) measurement data is collected from actual measurements of one or more Design of Experiments (DOE) metrology targets disposed on a second wafer.

6. The system of claim 5, wherein the first wafer and the second wafer are the same wafer.

7. The system of claim 1, wherein the one or more regularization structures and the one or more Design of Experiments (DOE) metrology targets are the same structures.

8. The system of claim 1, wherein the metrology tool collects an amount of measurement data from measurements of one or more metrology targets disposed on a third wafer, the one or more metrology targets characterized by one or more parameters of interest having unknown values, the computing system further configured to:
    estimate values of the parameters of interest of the one or more metrology targets from the amount of measurement data based on the trained measurement model.

9. The system of claim 1, wherein the trained measurement model is any of a neural network model, a linear model, a non-linear model, a polynomial model, a response surface model, a support vector machines model, a decision tree model, a random forest model, a deep network model, and a convolutional network model.

10. The system of claim 1, wherein the metrology tool is a spectroscopic metrology tool.

11. The system of claim 1, wherein a plurality of measurement performance metrics are employed to regularize the optimization function, and wherein at least one of the plurality of measurement performance metrics is weighted differently than another of the one or more measurement performance metrics.

12. A method comprising:
    receiving an amount of Design of Experiments (DOE) measurement data associated with measurements of one or more Design of Experiments (DOE) metrology targets;
    receiving known, reference values of one or more parameters of interest associated with the DOE metrology targets;
    receiving an amount of regularization measurement data from measurements of one or more regularization structures disposed on a first semiconductor wafer by a metrology tool;
    receiving values of one or more measurement performance metrics associated with the regularization measurement data; and
    training a measurement model based on an optimization function including the amount of Design of Experiments (DOE) measurement data, the reference values of one or more parameters of interest, the regularization measurement data, and the one or more measurement performance metrics, wherein the optimization function is regularized by the one or more measurement performance metrics.

13. The method of claim 12, wherein at least a portion of the amount of Design of Experiments (DOE) measurement data associated with measurements of one or more Design of Experiments (DOE) metrology targets is generated by a simulation.

14. The method of claim 13, wherein the reference values of one or more parameters of interest associated with the DOE metrology targets are known values associated with the simulation.

15. The method of claim 12, wherein at least a portion of the amount of Design of Experiments (DOE) measurement data is collected from actual measurements of one or more Design of Experiments (DOE) metrology targets disposed on a second wafer.

16. The method of claim 15, wherein the first wafer and the second wafer are the same wafer.

17. The method of claim 12, wherein the one or more regularization structures and the one or more Design of Experiments (DOE) metrology targets are the same structures.

18. The method of claim 12, further comprising:
receiving an amount of measurement data from measurements of one or more metrology targets disposed on a third wafer by the metrology tool, the one or more metrology targets characterized by one or more parameters of interest having unknown values; and
estimating values of the parameters of interest of the one or more metrology targets from the amount of measurement data based on the trained measurement model.

19. A system comprising:
a metrology tool including an illumination source and a detector configured to collect an amount of measurement data from measurements of one or more metrology targets disposed on a wafer; and
a computing system configured to:
receive the amount of measurement data;
receive values of one or more measurement performance metrics associated with the measurement data; and
estimate values of one or more parameters of interest characterizing the one or more metrology targets from the amount of measurement data based on a regression analysis including an optimization function that is regularized by the one or more measurement performance metrics.

20. A method comprising:
receiving an amount of measurement data from measurements of one or more metrology targets disposed on a semiconductor wafer;
receiving values of one or more measurement performance metrics associated with the measurement data; and
estimating values of one or more parameters of interest characterizing the one or more metrology targets from the amount of measurement data based on a regression analysis including an optimization function that is regularized by the one or more measurement performance metrics.

* * * * *